(12) United States Patent
Liu et al.

(10) Patent No.: US 12,133,435 B2
(45) Date of Patent: Oct. 29, 2024

(54) DISPLAY PANEL AND MANUFACTURING METHOD THEREOF AND DISPLAY APPARATUS

(71) Applicant: KunShan Go-Visionox Opto-Electronics Co., Ltd, Jiangsu (CN)

(72) Inventors: Mingxing Liu, Kunshan (CN); Zhiyuan Zhang, Kunshan (CN); Panpan Wang, Kunshan (CN); Chao Chi Peng, Kunshan (CN); Shuaiyan Gan, Kunshan (CN); Weili Li, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 414 days.

(21) Appl. No.: 17/523,203

(22) Filed: Nov. 10, 2021

(65) Prior Publication Data

US 2022/0069024 A1    Mar. 3, 2022

Related U.S. Application Data

(63) Continuation of application No. PCT/CN2020/108654, filed on Aug. 12, 2020.

(30) Foreign Application Priority Data

Nov. 20, 2019    (CN) .......................... 201911141789.1

(51) Int. Cl.
*H10K 59/30*    (2023.01)
*H10K 50/852*    (2023.01)
*H10K 71/00*    (2023.01)

(52) U.S. Cl.
CPC .......... *H10K 59/30* (2023.02); *H10K 50/852* (2023.02); *H10K 71/00* (2023.02)

(58) Field of Classification Search
CPC .... H10K 59/30; H10K 50/852; H10K 59/876; H10K 71/00; H10K 50/82; H10K 50/15;
(Continued)

(56) References Cited

U.S. PATENT DOCUMENTS 10,529,957 B2 * 1/2020 Song .................... H10K 59/353
2011/0248249 A1 * 10/2011 Forrest .................. H10K 50/11
257/40
(Continued)

FOREIGN PATENT DOCUMENTS

CN         1658718 A      8/2005
CN       102024844 A      4/2011
(Continued)

OTHER PUBLICATIONS

The International search report for PCT Application No. PCT/CN2020/108654, dated Oct. 16, 2020, 10 pages.
(Continued)

*Primary Examiner* — Vu A Vu
*Assistant Examiner* — Jeremy Daniel Watts
(74) *Attorney, Agent, or Firm* — Maier & Maier, PLLC

(57) ABSTRACT

The present application discloses a display panel and manufacturing method thereof and a display apparatus. The display panel includes: a first sub-pixel disposed in the first display area and including a first light-emitting structure, and the first light-emitting structure including at least one first common layer disposed between the first electrode and the second electrode; and a second sub-pixel disposed in the second display area and including a second light-emitting structure, and the second light-emitting structure including at least one second common layer disposed between the
(Continued)

third electrode and the fourth electrode, in which a thickness of the fourth electrode is smaller than a thickness of the second electrode, and a total thickness of the at least one second common layer is greater than a total thickness of the at least one first common layer.

16 Claims, 3 Drawing Sheets

(58) Field of Classification Search
CPC ...... H10K 50/16; H10K 50/17; H10K 50/171; H10K 2102/351; H10K 59/121; H10K 59/12; H10K 59/1201; C23C 14/24; C23C 14/12
See application file for complete search history.

(56) References Cited

U.S. PATENT DOCUMENTS

| | | | |
|---|---|---|---|
| 2012/0268000 A1* | 10/2012 | Choi | H10K 50/828 |
| | | | 313/504 |
| 2015/0137082 A1* | 5/2015 | Kim | H10K 50/805 |
| | | | 257/40 |
| 2015/0364715 A1 | 12/2015 | Yoon et al. | |
| 2017/0110519 A1* | 4/2017 | Hsu | H10K 50/852 |
| 2019/0181201 A1* | 6/2019 | Kim | H10K 50/828 |
| 2019/0296264 A1 | 9/2019 | Mathai et al. | |
| 2020/0161585 A1* | 5/2020 | Palles-Dimmock | H10K 59/38 |
| 2020/0243617 A1* | 7/2020 | Saito | H10K 71/166 |
| 2021/0028248 A1* | 1/2021 | Kim | H10K 59/122 |
| 2021/0327977 A1* | 10/2021 | Li | H10K 59/173 |
| 2022/0190084 A1* | 6/2022 | Li | G09G 3/3233 |

FOREIGN PATENT DOCUMENTS

| | | |
|---|---|---|
| CN | 104919593 A | 9/2015 |
| CN | 105098094 A | 11/2015 |
| CN | 105895659 A | 8/2016 |
| CN | 107154424 A | 9/2017 |
| CN | 110018610 A | 7/2019 |
| CN | 110061014 A | 7/2019 |
| CN | 110265462 A | 9/2019 |
| CN | 110867524 A | 3/2020 |
| JP | 2015-062194 A | 4/2015 |
| KR | 20140086322 A | 7/2014 |
| WO | 2021098294 A | 5/2021 |

OTHER PUBLICATIONS

The First Office Action for Chinese Application No. 201911141789. 1, dated Feb. 19, 2021, 10 pages.
The Rejection Decision for Chinese Application No. 201911141789. 1, dated Jul. 6, 2021, 6 pages.
The Second Office Action dated Mar. 30, 2022, corresponding to Chinese Application No. 201911141789.1, 10 pages (with English Translation).
The Third Office Action dated Jul. 29, 2022, corresponding to Chinese Application No. 201911141789.1, 8 pages (with Partial English Translation).

* cited by examiner

DISPLAY PANEL AND MANUFACTURING METHOD THEREOF AND DISPLAY APPARATUS

CROSS REFERENCE TO RELATED APPLICATION

The present application is a continuation of International Application No. PCT/CN2020/108654 filed on Aug. 12, 2020, which claims the benefit of priority to Chinese Patent Application No. 201911141789.1 filed on Nov. 20, 2019, both of which are incorporated herein by reference in their entireties.

TECHNICAL FIELD

The present application relates to the field of display, and particularly to a display panel and manufacturing method thereof and a display apparatus.

BACKGROUND

Organic Light-Emitting Diode (Organic Light-Emitting Diode, OLED) display panels are widely used in various consumer electronics such as mobile phones, TVs, personal digital assistants, digital cameras, notebook computers and desktop computers for high image quality, power saving, thin body and wide application and the like, which have become the mainstream of display apparatuses.

The sub-pixel structure of the OLED display panel includes an anode, a light-emitting structure and a cathode, which can be formed through evaporation. Nonetheless, taking the evaporation of the cathode as an example, part of the OLED display panel may be shielded during the evaporation, thus the cathode in the shielded area and the cathode in other unshielded area are different in thickness, resulting in that the display color coordinates of the sub-pixel in the shielded area and the sub-pixel in the unshielded area are different.

SUMMARY

The present application provides a display panel and manufacturing method thereof and a display apparatus.

In a first aspect, the embodiments of the present application provide a display panel, comprising: a first display area; a second display area adjacent to the first display area; a first sub-pixel disposed in the first display area and comprising a first electrode, a first light-emitting structure disposed on the first electrode, and a second electrode disposed on the first light-emitting structure, the first light-emitting structure comprising at least one first common layer disposed between the first electrode and the second electrode; and a second sub-pixel disposed in the second display area and comprising a third electrode, a second light-emitting structure disposed on the third electrode, and a fourth electrode disposed on the second light-emitting structure, the second light-emitting structure comprising at least one second common layer disposed between the third electrode and the fourth electrode, wherein a thickness of the fourth electrode is smaller than a thickness of the second electrode, and a total thickness of the at least one second common layer is greater than a total thickness of the at least one first common layer.

In a second aspect, the embodiments of the present application provide a display apparatus comprising the display panel of any of the above embodiments.

In a third aspect, the embodiments of the present application provide a method for manufacturing a display panel, comprising: providing an array substrate having a first display area and a second display area adjacent to each other; forming a first electrode on the first display area of the array substrate and a third electrode on the second display area of the array substrate; forming a first light-emitting structure on the first electrode, comprising forming at least one first common layer; forming a second light-emitting structure on the third electrode, comprising forming at least one second common layer, and a total thickness of the at least one second common layer being greater than a total thickness of the at least one first common layer; and simultaneously performing evaporation on the first light-emitting structure and the second light-emitting structure to form a second electrode on the first light-emitting structure and a fourth electrode on the second light-emitting structure, and shielding the second display area so that a thickness of the fourth electrode is smaller than a thickness of the second electrode.

Optionally, the display panel further comprises a light-transmitting area, such that a photosensitive component may be integrated on the rear of the light-transmitting area of the display panel, and an under-screen integration is achieved for the photosensitive component such as a camera.

BRIEF DESCRIPTION OF THE DRAWINGS

Other features, objects, and advantages of the present application will become more apparent by reading the following detailed description of non-limiting embodiments with reference to the accompanying drawings, in which the same or similar reference numerals represent the same or similar features. The accompanying drawings are not drawn to actual scale.

DETAILED DESCRIPTION

In order to make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details.

The embodiments of the present application provide a display panel, which may be an Organic Light Emitting Diode (Organic Light Emitting Diode, OLED) display panel. The display panel of the embodiments of the present application will be described in detail below with reference to the accompanying drawings.

Figure 1:
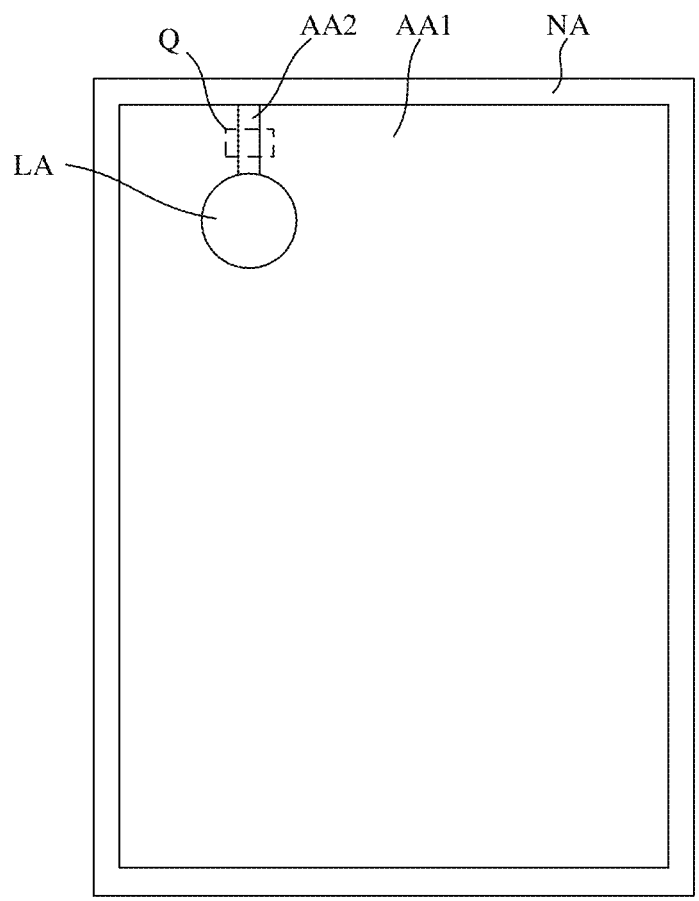
FIG. 1 is a top view of a display panel provided by an embodiment of the present application.

FIG. 1 is a top view of a display panel provided by an embodiment of the present application. The display panel 100 includes a first display area AA1 and a second display area AA2 adjacent to each other.

Optionally, the display panel 100 further includes a first non-display area NA and a light-transmitting area LA. The first non-display area NA surrounds the first display area AA1, the first display area AA1 surrounds the light-transmitting area LA, and the second display area AA2 extends from the light-transmitting area LA through the first display area AA1 to be connected with the first non-display area NA.

Optionally, the light-transmitting area LA is a second non-display area. Optionally, the light-transmitting area LA is a third display area, and a transmittance of the third display area is greater than a transmittance of the first display area AA1.

If the light-transmitting area LA is the third display area, the transmittance of the light-transmitting area LA is greater than or equal to 15%. To ensure that the transmittance of the light-transmitting area LA is greater than 15%, or even greater than 40%, or even a higher transmittance, the transmittance of at least part of functional films in the light-transmitting area LA of the display panel 100 is greater than 80%, and even the transmittance of at least part of the functional films is greater than 90%.

According to the display panel 100 of the embodiments of the present application which includes the light-transmitting area LA, a photosensitive component may be integrated on the rear of the light-transmitting area LA of the display panel 100, and an under-screen integration is achieved for the photosensitive component such as a camera. Optionally, the light-transmitting area LA is the third display area, such that not only the photosensitive component may be integrated on the rear of the light-transmitting area LA of the display panel 100, but also the light-transmitting area LA can display the image, thus the display area of the display panel 100 is increased and a full-screen design is achieved for the display apparatus.

Figure 2:
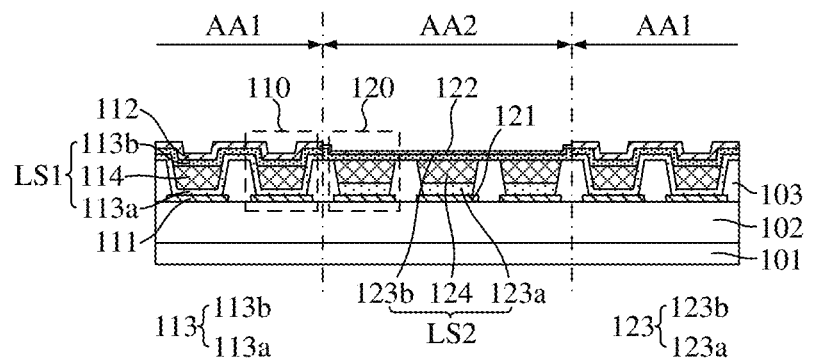
FIG. 2 is a partial enlarged schematic diagram of the area Q of the display panel in FIG. 1 provided by an embodiment of the present application.

FIG. 2 is a partial enlarged schematic diagram of the area Q of the display panel in FIG. 1 provided by an embodiment of the present application. The display panel 100 includes a first sub-pixel 110 disposed in the first display area AA1 and a second sub-pixel 120 disposed in the second display area AA2.

The first sub-pixel 110 includes a first electrode 111, a first light-emitting structure LS1 disposed on the first electrode 111, and a second electrode 112 disposed on the first light-emitting structure LS1. Herein, the first light-emitting structure LS1 includes at least one first common layer 113 disposed between the first electrode 111 and the second electrode 112. One of the first electrode 111 and the second electrode 112 is an anode and the other is a cathode.

The second sub-pixel 120 includes a third electrode 121, a second light-emitting structure LS2 disposed on the third electrode 121, and a fourth electrode 122 disposed on the second light-emitting structure LS2. Herein, the second light-emitting structure LS2 includes at least one second common layer 123 disposed between the third electrode 121 and the fourth electrode 122. One of the third electrode 121 and the fourth electrode 122 is an anode and the other is a cathode.

In the present application, the "common layer" refers to a functional layer associated with carriers in the light-emitting structure, including but not limited to a layer structure that realizes a function such as carrier injection, carrier transport, or carrier blocking.

In the embodiment, for example, the first electrode 111 and the third electrode 121 are anodes, and the second electrode 112 and the fourth electrode 122 are cathodes.

A thickness of the fourth electrode 122 is smaller than a thickness of the second electrode 112, and a total thickness of the at least one second common layer 123 is greater than a total thickness of the at least one first common layer 113.

Each film layer included in the first sub-pixel 110 and the second sub-pixel 120 may be formed by evaporation. Nonetheless, taking the evaporation of the second electrode 112 and the fourth electrode 122 as an example, the second display area AA2 of the display panel 100 may be shielded during the evaporation, thus the thickness of the fourth electrode 122 of the second display area AA2 is smaller than the thickness of the second electrode 112 of the first display area AA1. The above difference in electrode thickness results in that the second sub-pixel 120 of the second display area AA2 and the first sub-pixel 110 of the first display area AA1 are different in display color coordinate.

According to the display panel 100 of the embodiments of the present application, the microcavity structure formed at the second sub-pixel 120 is adjusted by controlling the thickness of at least one second common layer 123 of the second sub-pixel 120, thereby adjusting the color coordinate of the second sub-pixel 120 during display, the color coordinate difference between the second sub-pixel 120 and the first sub-pixel 110 is reduced, and the display uniformity of the first display area AA1 and the second display area AA2 of the display panel 100 is improved.

Optionally, the display panel 100 includes a substrate 101, a device layer 102 disposed on the substrate 101, and a pixel defining layer 103 disposed on the device layer 102.

The substrate 101 may be made of a light-transmitting material such as glass, Polyimide (Polyimide, PI). The device layer 102 may include pixel circuits for driving each of the sub-pixels for display. The pixel defining layer 103 includes pixel openings, positions of which are corresponding to the positions of the sub-pixels respectively. For example, some of the pixel openings are configured to accommodate the first light-emitting structure LS1, and some of the pixel openings are configured to accommodate the second light-emitting structure LS2.

Optionally, the first light-emitting structure LS1 further includes a first emitting layer (Emitting Layer, EML) 114, and the at least one first common layer 113 includes a first sub-common layer 113a disposed between the first electrode 111 and the first emitting layer 114 and a second sub-common layer 113b disposed between the first emitting layer 114 and the second electrode 112.

The second light-emitting structure LS2 further includes a second emitting layer 124. The at least one second common layer 123 includes a third sub-common layer 123a disposed between the third electrode 121 and the second emitting layer 124 and a fourth sub-common layer 123b disposed between the second emitting layer 124 and the fourth electrode 122.

In the embodiment, the first sub-pixel 110 may include a red first sub-pixel, a green first sub-pixel, or a blue first sub-pixel according to the color of the emitted light of the first emitting layer 114. In some other embodiments, the first sub-pixel 110 may also include first sub-pixels of other colors such as white and cyan. Similarly, the second sub-pixel 120 may include a red second sub-pixel, a green second sub-pixel, or a blue second sub-pixel according to the color of the emitted light of the second emitting layer 124. In some other embodiments, the second sub-pixel 120 may also include second sub-pixels of other colors such as white and cyan.

The first sub-common layer 113a and the third sub-common layer 123a respectively includes at least one of a first carrier inject layer, a first carrier transport layer, and a second carrier barrier layer. The second sub-common layer 113b and the fourth sub-common layer 123b respectively comprises at least one of a second carrier inject layer, a second carrier transport layer, and a first carrier barrier layer. Herein, one of the first carrier and the second carrier is a hole and the other is an electron.

For example, in the embodiment, the first sub-common layer 113a and the third sub-common layer 123a respectively includes a hole inject layer (Hole Inject Layer, HIL) and a hole transport layer (Hole Transport Layer, HTL). The first electrode 111, the hole inject layer of the first sub-common layer 113a, the hole transport layer of the first sub-common layer 113a, and the first emitting layer 114 are stacked in sequence. The third electrode 121, the hole inject layer of the third sub-common layer 123a, the hole transport layer of the third sub-common layer 123a, and the second emitting layer 124 are stacked in sequence.

The second sub-common layer 113b and the fourth sub-common layer 123b respectively includes an electron inject layer (Electron Inject Layer, EIL) and an electron transport layer (Electron Transport Layer, ETL). The first emitting layer 114, the electron transport layer of the second sub-common layer 113b, the electron inject layer of the second sub-common layer 113b, and the second electrode 112 are stacked in sequence. The second emitting layer 124, the electron transport layer of the fourth sub-common layer 123b, the electron inject layer of the fourth sub-common layer 123b, and the fourth electrode 122 are stacked in sequence.

Optionally, a thickness of the third sub-common layer 123a is greater than a thickness of the first sub-common layer 113a; and/or a thickness of the fourth sub-common layer 123b is greater than a thickness of the second sub-common layer 113b.

For example, in the embodiment, the thickness of the third sub-common layer 123a is greater than the thickness of the first sub-common layer 113a. The microcavity structure formed at the second sub-pixel 120 is adjusted by adjusting the thickness of the third sub-common layer 123a, thereby adjusting the color coordinate of the second sub-pixel 120 during display, the color coordinate difference between the second sub-pixel 120 and the first sub-pixel 110 is reduced, and the display uniformity of the first display area AA1 and the second display area AA2 of the display panel 100 is improved.

In the embodiment, the third sub-common layers 123a of adjacent second sub-pixels 120 are spaced from each other. The third sub-common layer 123a of the second sub-pixel 120 is formed, for example, by fine metal mask (Fine Metal Mask, FMM) evaporation, and the third sub-common layers 123a of adjacent second sub-pixels 120 are independent of each other.

Figure 3:
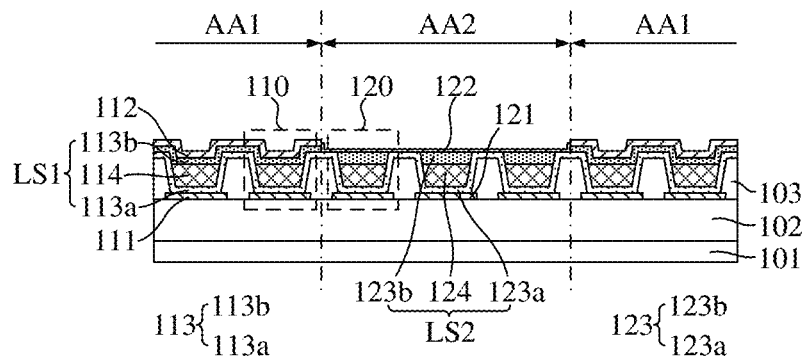
FIG. 3 is a partial enlarged schematic diagram of the area Q of the display panel in FIG. 1 provided by an alternative embodiment of the present application, in which fourth sub-common layers of adjacent second sub-pixels are spaced from each other.

FIG. 3 is a partial enlarged schematic diagram of the area Q of the display panel in FIG. 1 provided by an alternative embodiment of the present application. Part of the structure of the alternative embodiment is the same as that of the previous embodiments, which will not be described in detail, and the differences will be described below.

In the alternative embodiment, the thickness of the third sub-common layer 123a is the same as the thickness of the first sub-common layer 113a, and the thickness of the fourth sub-common layer 123b is greater than the thickness of the second sub-common layer 113b. The microcavity structure formed at the second sub-pixel 120 may also be adjusted by adjusting the thickness of the fourth sub-common layer 123b, thereby adjusting the color coordinate of the second sub-pixel 120 during display, the color coordinate difference between the second sub-pixel 120 and the first sub-pixel 110 is reduced, and the display uniformity of the first display area AA1 and the second display area AA2 of the display panel 100 is improved.

In the alternative embodiment, the fourth sub-common layers 123b of adjacent second sub-pixels 120 are spaced from each other. The fourth sub-common layer 123b of the second sub-pixel 120 is formed, for example, by FMM evaporation, and the fourth sub-common layers 123b of adjacent second sub-pixels 120 are independent of each other.

It can be understood that in some other embodiments, it may be the case that the thickness of the third sub-common layer 123a is greater than the thickness of the first sub-common layer 113a, and moreover, the thickness of the fourth sub-common layer 123b is greater than the thickness of the second sub-common layer 113b. The color coordinate of the second sub-pixel 120 during display is adjusted by adjusting the thickness of the third sub-common layer 123a and the fourth sub-common layer 123b.

In addition, in the above embodiment, the third sub-common layers 123a of adjacent second sub-pixels 120 are spaced from each other; and/or the fourth sub-common layers 123b of adjacent second sub-pixels 120 are spaced from each other. Nonetheless, the arrangement of the third sub-common layer 123a and the fourth sub-common layer 123b may not be limited thereto.

Figure 4:
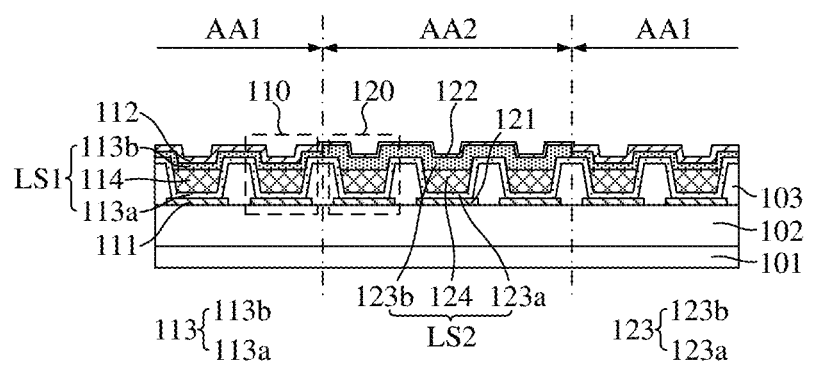
FIG. 4 is a partial enlarged schematic diagram of the area Q of the display panel in FIG. 1 provided by another alternative embodiment of the present application, in which third sub-common layers of adjacent second sub-pixels are interconnected, and fourth sub-common layers of adjacent second sub-pixels are interconnected.

FIG. 4 is a partial enlarged schematic diagram of the area Q of the display panel in FIG. 1 provided by another alternative embodiment of the present application. Part of the structure of the alternative embodiment is the same as that of the previous embodiments, which will not be described in detail, and the differences will be described below.

In the another alternative embodiment, the third sub-common layers 123a of adjacent second sub-pixels 120 are interconnected, and the fourth sub-common layers 123b of adjacent second sub-pixels 120 are interconnected. The sub-third common layer 123a and the fourth sub-common layer 123b of the second sub-pixel 120 may each be formed by common metal mask (Common Metal Mask, CMM) evaporation.

Alternatively, it may be the case that the third sub-common layers 123a of adjacent second sub-pixels 120 are interconnected, and the fourth sub-common layers 123b of adjacent second sub-pixels 120 are spaced from each other. Or alternatively, the third sub-common layers 123a of adjacent second sub-pixels 120 are spaced from each other, and the fourth sub-common layers 123b of adjacent second sub-pixels 120 are interconnected.

Optionally, the third sub-common layer 123a of the second display area AA2 and the first sub-common layer 113a of the first display area AA1 are interconnected; and/or the fourth sub-common layer 123b of the second display area AA2 and the second sub-common layer 113b of the first display area AA1 are interconnected. For example, in the embodiment, the thickness of the third sub-common layer 123a of the second display area AA2 is the same as the thickness of the first sub-common layer 113a of the first display area AA1, and the third sub-common layer 123a of the second display area AA2 and the first sub-common layer 113a of the first display area AA1 may be simultaneously formed by the CMM evaporation, and the manufacturing efficiency of the display panel 100 is improved.

The embodiments of the present application also provide a display apparatus including the display panel 100 of any of the above embodiments. According to the display apparatus of the embodiments of the present application, the display panel 100 thereof includes the first sub-pixel 110 disposed in the first display area AA1 and the second sub-pixel 120 disposed in the second display area AA2. The thickness of the fourth electrode 122 of the second sub-pixel 120 is smaller than the thickness of the second electrode 112 of the first sub-pixel 110, and moreover, the total thickness of the at least one second common layer 123 of the second sub-pixel 120 is greater than the total thickness of the at least one first common layer 113 of the first sub-pixel 110. The microcavity structure formed at the second sub-pixel 120 is adjusted by controlling the thickness of at least one second common layer 123 of the second sub-pixel 120, thereby adjusting the color coordinate of the second sub-pixel 120 during display, the color coordinate difference between the second sub-pixel 120 and the first sub-pixel 110 is reduced, and the display uniformity of the display apparatus is improved.

Figure 5:
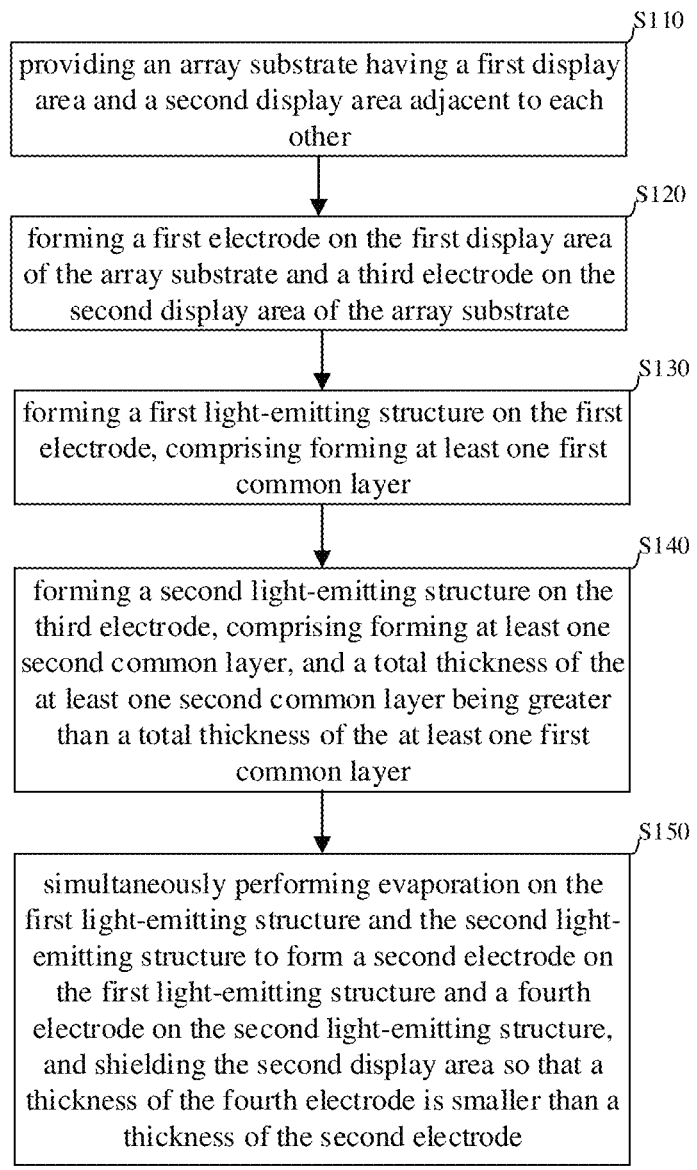
FIG. 5 is a flowchart of a method for manufacturing a display panel provided by an embodiment of the present application.

The embodiments of the present application also provide a method for manufacturing a display panel. FIG. 5 is a flowchart of a method for manufacturing a display panel provided by an embodiment of the present application, which includes steps S110 to S150.

In step S110, an array substrate having a first display area and a second display area adjacent to each other is provided. Optionally, the array substrate includes a substrate and a device layer on the substrate.

In step S120, a first electrode is formed on the first display area of the array substrate and a third electrode is formed on the second display area of the array substrate.

For example, the first electrode and the third electrode are anodes, and optionally, the first electrode and the third electrode include a reflective layer. For example, the first electrode includes a first light-transmitting conductive layer, a reflective layer disposed on the first light-transmitting conductive layer, and a second light-transmitting conductive layer disposed on the reflective layer. Herein, the first light-transmitting conductive layer and the second light-transmitting conductive layer may be indium tin oxide (Indium Tin Oxide, ITO), indium zinc oxide, etc., and the reflective layer may be a metal layer, for example, made of silver. The third electrode may be configured to use the same material as the first electrode.

In step S130, a first light-emitting structure is formed on the first electrode, including forming at least one first common layer. Optionally, the first light-emitting structure includes a first emitting layer, the at least one first common layer is disposed between the first electrode and the first emitting layer and/or on the first emitting layer, and the at least one first common layer is a layer structure that realizes a function such as carrier injection, carrier transport, or carrier blocking.

In step S140, a second light-emitting structure is formed on the third electrode, comprising forming at least one second common layer, in which a total thickness of the at least one second common layer is greater than a total thickness of the at least one first common layer.

Optionally, the second light-emitting structure includes a second emitting layer, the at least one second common layer is disposed between the second electrode and the second emitting layer and/or on the second emitting layer, and the at least one second common layer is a layer structure that realizes a function such as carrier injection, carrier transport, or carrier blocking.

Optionally, part of the structure of the at least one second common layer and part of the structure of the at least one first common layer with the same function may be simultaneously formed.

In step S150, evaporation is simultaneously performed on the first light-emitting structure and the second light-emitting structure to form a second electrode on the first light-emitting structure and a fourth electrode on the second light-emitting structure, and the second display area is shielded so that a thickness of the fourth electrode is smaller than a thickness of the second electrode.

Optionally, the second electrode includes a magnesium-silver alloy layer. The fourth electrode may be configured to use the same material as the second electrode. Optionally, the second electrode and the fourth electrode may be interconnected as a common electrode.

According to the method for manufacturing the display panel of the embodiments of the present application, during the manufacturing, the microcavity structure formed at the second sub-pixel is adjusted by controlling the thickness of at least one second common layer of the second sub-pixel, thereby adjusting the color coordinate of the second sub-pixel during display, the color coordinate difference between the second sub-pixel and the first sub-pixel is reduced, and the display uniformity of the first display area and the second display area of the manufactured display panel is improved.

The above embodiments of the present application do not exhaustively describe all the details, nor do they limit the present application to merely the specific embodiments described. Obviously, according to the above description, many modifications and changes can be made. These embodiments are selected and specifically described in the specification to better explain the principles and practical applications of the present application, so that those skilled in the art are able to make good use of the present application and make modifications on the basis of the present application. The present application is only defined by the claims and their full scope and equivalents.

What is claimed is:

1. A display panel comprising:
   a first display area;
   a light-transmitting area, wherein the first display area surrounds the light-transmitting area;
   a first non-display area, wherein the first non-display area surrounds both the first display area and the light-transmitting area;
   a second display area adjacent to the first display area;
   a first sub-pixel disposed in the first display area and comprising a first electrode, a first light-emitting structure disposed on the first electrode, and a second electrode disposed on the first light-emitting structure, the first light-emitting structure comprising:
   at least one first common layer disposed between the first electrode and the second electrode, and
   a first emitting layer, wherein the at least one first common layer comprises a first sub-common layer disposed between the first electrode and the first emitting layer and a second sub-common layer disposed between the first emitting layer and the second electrode, and the second sub-common layer comprises both an electron inject layer and an electron transport layer; and a second sub-pixel disposed in the second display area and comprising a third electrode, a second light-emitting structure disposed on the third electrode, and a fourth electrode disposed on the second light-emitting structure, the second light-emitting structure comprising:

at least one second common layer disposed between the third electrode and the fourth electrode, and a second emitting layer, wherein the at least one second common layer comprises a third sub-common layer disposed between the third electrode and the second emitting layer and a fourth sub-common layer disposed between the second emitting layer and the fourth electrode, the fourth sub-common layer comprises both an electron inject layer and an electron transport layer, a thickness of the third sub-common layer is greater than a thickness of the first sub-common layer, a thickness of the fourth sub-common layer is greater than a thickness of the second sub-common layer, a thickness of the fourth electrode is smaller than a thickness of the second electrode, a total thickness of the at least one second common layer is greater than a total thickness of the at least one first common layer.

2. The display panel of claim 1, further comprising:

a light-transmitting area, wherein the second display area extends from the light-transmitting area through the first display area to be connected with the first non-display area.

3. The display panel of claim 2, wherein the light-transmitting area is a second non-display area.

4. The display panel of claim 2, wherein the light-transmitting area is a third display area, and a transmittance of the third display area is greater than a transmittance of the first display area.

5. The display panel of claim 4, wherein a transmittance of the light-transmitting area is greater than or equal to 15%.

6. The display panel of claim 1, wherein a thickness of the third sub-common layer is greater than a thickness of the first sub-common layer.

7. The display panel of claim 1, wherein the first sub-common layer and the third sub-common layer respectively comprise a hole inject layer and a hole transport layer, and the first electrode, the hole inject layer, the hole transport layer, and the first emitting layer are stacked in sequence.

8. The display panel of claim 1, wherein the third sub-common layers are spaced from each other.

9. The display panel of claim 1, wherein the fourth sub-common layers are spaced from each other.

10. The display panel of claim 1, wherein the third sub-common layers are interconnected.

11. The display panel of claim 10, wherein the third sub-common layer of the second display area and the first sub-common layer of the first display area are interconnected.

12. The display panel of claim 1, wherein the fourth sub-common layers of adjacent second sub-pixels are interconnected.

13. The display panel of claim 12, wherein the fourth sub-common layer of the second display area and the second sub-common layer of the first display area are interconnected.

14. A display apparatus comprising the display panel of claim 1.

15. The display panel of claim 1, wherein the second sub-common layer and the fourth sub-common layer respectively comprise an electron inject layer and an electron transport layer, and the second emitting layer, the electron transport layer, the electron inject layer, and the fourth electrode are stacked in sequence.

16. The display panel of claim 1, wherein a thickness of the fourth sub-common layer is greater than a thickness of the second sub-common layer.

* * * * *